US010804331B2

(12) United States Patent
Zhang et al.

(10) Patent No.: US 10,804,331 B2
(45) Date of Patent: Oct. 13, 2020

(54) DISPLAY SUBSTRATE AND FABRICATION METHOD THEREOF, DISPLAY DEVICE

(71) Applicant: BOE TECHNOLOGY GROUP CO., LTD., Beijing (CN)

(72) Inventors: Yuxin Zhang, Beijing (CN); Hongfei Cheng, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/771,793

(22) PCT Filed: Sep. 13, 2017

(86) PCT No.: PCT/CN2017/101538
§ 371 (c)(1),
(2) Date: Apr. 27, 2018

(87) PCT Pub. No.: WO2018/113348
PCT Pub. Date: Jun. 28, 2018

(65) Prior Publication Data
US 2019/0081109 A1 Mar. 14, 2019

(30) Foreign Application Priority Data
Dec. 23, 2016 (CN) .......................... 2016 1 1207680

(51) Int. Cl.
*H01L 51/56* (2006.01)
*H01L 27/32* (2006.01)
(Continued)

(52) U.S. Cl.
CPC ........ *H01L 27/322* (2013.01); *H01L 27/3272* (2013.01); *H01L 51/5036* (2013.01); *H01L 51/5284* (2013.01); *H01L 51/56* (2013.01)

(58) Field of Classification Search
CPC ....................................................... H01L 51/52
See application file for complete search history.

(56) References Cited

U.S. PATENT DOCUMENTS

| 7,050,103 B2 | 5/2006 | Fushimi et al. |
| 2002/0012062 A1 | 1/2002 | Fushimi et al. |
| | (Continued) | |

FOREIGN PATENT DOCUMENTS

| CN | 101728404 A | 6/2010 |
| CN | 102998841 A | 3/2013 |
| | (Continued) | |

OTHER PUBLICATIONS

International search report dated Dec. 20, 2017 for international application No. PCT/CN2017/101538 with English translation attached.
(Continued)

*Primary Examiner* — Fernando L Toledo
*Assistant Examiner* — Valerie N Newton
(74) *Attorney, Agent, or Firm* — Nath, Goldberg & Meyer; Joshua B. Goldberg; Stephanie F. Majkut

(57) ABSTRACT

The present application provides a display substrate, a method for fabricating the same, and a display device, belongs to the field of display technology, and can solve the problem of lowered product yield resulted from generation of gas by a transfer material in the process of forming a color filter by a laser transfer process in the related art. The display substrate of the present application includes a base substrate and a color filter and an auxiliary portion on the base substrate. The color filter and the auxiliary portion are integrally formed, and a gas hole is provided in the auxiliary portion.

20 Claims, 5 Drawing Sheets

(51) Int. Cl.
*H01L 51/52* (2006.01)
*H01L 51/50* (2006.01)

(56) References Cited

U.S. PATENT DOCUMENTS

| | | | | |
|---|---|---|---|---|
| 2011/0198572 | A1* | 8/2011 | Park | H01L 27/3258 257/40 |
| 2015/0034921 | A1* | 2/2015 | Kim | H01L 27/3272 257/40 |
| 2015/0048330 | A1* | 2/2015 | Kang | H01L 51/5209 257/40 |
| 2015/0318447 | A1 | 11/2015 | Choi | |

FOREIGN PATENT DOCUMENTS

| | | |
|---|---|---|
| CN | 104111564 A | 10/2014 |
| CN | 104375317 A | 2/2015 |
| CN | 104377224 A | 2/2015 |
| CN | 104793357 A | 7/2015 |
| CN | 206322699 U | 7/2017 |
| KR | 10-2012-0133955 A | 12/2012 |
| KR | 1020120133955 A | 12/2012 |
| KR | 10-2014-0137740 A | 12/2014 |
| KR | 1020150019718 A | 2/2015 |
| KR | 1020150129551 A | 11/2015 |

OTHER PUBLICATIONS

Korean First Office Action Application No. 10-2018-7013034; dated Aug. 27, 2019; English Translation Attached.
First Office Action dated Nov. 28, 2019 for corresponding Indian application 201837010747.
CN First Office Action; Application No. 201611207680.X; dated Jun. 5, 2019; With English Translation.
Second Office Action dated Apr. 22, 2020 for corresponding Korean application 10-2018-7013034.

* cited by examiner

DISPLAY SUBSTRATE AND FABRICATION METHOD THEREOF, DISPLAY DEVICE

CROSS-REFERENCE TO RELATED APPLICATION

This is a National Phase Application filed under 35 U.S.C. 371 as a national stage of PCT/CN2017/101538, filed Sep. 13, 2017, an application claiming the benefit of Chinese Patent Application No. 201611207680.X filed on Dec. 23, 2016, the contents of which are incorporated herein in their entirety by reference.

TECHNICAL FIELD

The present disclosure belongs to the field of display technology, and particularly relates to a display substrate, a fabrication method thereof, and a display device.

BACKGROUND

A silicon-based organic light emitting diode (silicon-based OLED) micro display uses a monocrystalline silicon chip as a base substrate, and a silicon-based OLED has a pixel size that is only one-tenth of a pixel size of a traditional display device. Therefore, the sophistication in the fabrication process of the silicon-based OLED micro display is much higher than that of the traditional display device. For example, a distance between pixels in the silicon-based OLED is only 1 μm, thus resulting in high process difficulty in fabrication of a color filter of a color silicon-based OLED display.

SUMMARY

At least one embodiment of the present disclosure provides a display substrate, a method for fabricating the same, and a display device, which can improve product yield of silicon-based OLED devices.

An embodiment of the present disclosure provides a display substrate, including a base substrate and a plurality of pixel regions on one side of the base substrate, each of at least one pixel region of the plurality of pixel regions is provided with a color filter and an auxiliary portion, the color filter and the auxiliary portion are integrally formed, and a gas hole is provided in the auxiliary portion.

In some embodiments, the auxiliary portion is in a peripheral region of the color filter.

In some embodiments, the display substrate further comprises a light-shielding pattern between at least two adjacent pixel regions of the plurality of pixel regions.

In some embodiments, the light-shielding pattern includes a black matrix.

In some embodiments, the black matrix comprises a gas hole.

In some embodiments, at least three adjacent pixel regions of the plurality of pixel regions are provided with color filters of different colors, which include a red filter, a green filter and a blue filter, and the light-shielding pattern includes a first portion, a second portion and a third portion sequentially stacked;

the red filter and the first portion are formed simultaneously and made of a same material;

the green filter and the second portion are formed simultaneously and made of a same material; and the blue filter and the third portion are formed simultaneously and made of a same material.

In some embodiments, each of the first portion, the second portion and the third portion is provided with a gas hole.

In some embodiments, the first portion is the auxiliary portion, which is adjacent to the first portion and integrally formed with the red filter.

In some embodiments, the base substrate includes a monocrystalline silicon chip.

In some embodiments, the gas hole is a groove or a through hole.

In some embodiments, between the base substrate and the color filter, an insulation layer, a first electrode, an organic light emitting diode, a second electrode and a planarization layer are sequentially provided on the base substrate.

In some embodiments, the organic light emitting diode is a white organic light emitting diode.

As another technical solution, the present disclosure further provides a display device including any one of the above display substrates.

As another technical solution, the present disclosure further provides a method for fabricating the above display substrate, including:

forming the color filter and the auxiliary portion on the base substrate by a single patterning process, such that the gas hole is formed in the auxiliary portion.

In some embodiments, forming the color filter and the auxiliary portion on the base substrate by a single patterning process such that the gas hole is formed in the auxiliary portion includes:

sequentially providing a color filter material, a transfer sacrificial layer and a transfer substrate on the base substrate such that a hollow-out pattern allowing light to pass therethrough and a bulge preventing light from passing therethrough are provided at predetermined positions of the transfer substrate; and irradiating light to a corresponding position of the transfer sacrificial layer via the transfer substrate such that the transfer sacrificial layer is melt by heat, the color filter material corresponding to the hollow-out pattern is transferred to a position on the base substrate to form the color filter and the auxiliary portion, and the bulge allows the gas hole to be formed in the auxiliary portion.

In some embodiments, forming the color filter and the auxiliary portion on the base substrate by a single patterning process such that the gas hole is formed in the auxiliary portion includes:

sequentially providing a color filter material, a photothermal conversion layer and a transfer substrate on the base substrate such that a hollow-out pattern allowing light to pass therethrough is provided at a predetermined position of the transfer substrate, and a bulge preventing light from passing therethrough is provided at a predetermined position of the photothermal conversion layer; and irradiating light to a corresponding position of the photothermal conversion layer via the transfer substrate such that the light is converted to heat by the photothermal conversion layer, the color filter material corresponding to the hollow-out pattern is transferred to a predetermined position on the base substrate to form the color filter and the auxiliary portion, and the bulge allows the gas hole to be formed in the auxiliary portion.

In some embodiments, forming the color filter and the auxiliary portion on the base substrate by a single patterning process such that the gas hole is formed in the auxiliary portion includes:

sequentially providing a color filter material, a photothermal conversion layer, a transfer substrate and a transfer mask plate on the base substrate such that the transfer substrate is made of a transparent material, a hollow-out pattern allowing light to pass therethrough is provided at a predetermined position of the transfer mask plate, and a bulge preventing light from passing therethrough is provided at a predetermined position of the photothermal conversion layer;

irradiating light to a corresponding position of the photothermal conversion layer via the transfer mask plate and the transfer substrate such that the light is converted to heat by the photothermal conversion layer, the color filter material corresponding to the hollow-out pattern is transferred to a predetermined position on the base substrate to form the color filter and the auxiliary portion, and the bulge allows the gas hole to be formed in the auxiliary portion.

In some embodiments, the method further includes:

forming a light-shielding pattern between any two adjacent color filters.

In some embodiments, the light-shielding pattern includes a black matrix, and any two adjacent pixel regions are provided with color filters of different colors;

forming the light-shielding pattern between at least two adjacent color filters includes:

forming the black matrix by a laser transfer process such that a gas hole is formed in the black matrix.

In some embodiments, at least three adjacent pixel regions of the plurality of pixel regions are provided with color filters of different colors, which include a red filter, a green filter and a blue filter, and the light-shielding pattern includes a first portion, a second portion and a third portion sequentially stacked; and wherein forming the light-shielding pattern between any two adjacent color filters of the plurality of pixel regions and forming the color filter and the auxiliary portion on the base substrate by a single patterning process such that the gas hole is formed in the auxiliary portion are performed simultaneously, and include:

forming the red filter and the first portion by a single laser transfer process such that a gas hole is formed in the first portion;

forming the green filter and the second portion by a single laser transfer process such that a gas hole is formed in the second portion; and forming the blue filter and the third portion by a single laser transfer process such that a gas hole is formed in the third portion.

In some embodiments, prior to forming the color filter and the auxiliary portion on the base substrate by a single patterning process such that the gas hole is formed in the auxiliary portion, the method further includes:

forming the bases substrate of a monocrystalline silicon chip.

In some embodiments, the gas hole is a groove or a through hole.

In some embodiments, prior to forming the color filter and the auxiliary portion on the base substrate by a single patterning process such that the gas hole is formed in the auxiliary portion, the method further includes:

sequentially providing an insulation layer, a first electrode, an organic light emitting diode, a second electrode and a planarization layer on the base substrate.

In some embodiments, the organic light emitting diode is a white organic light emitting diode.

Figure 1:
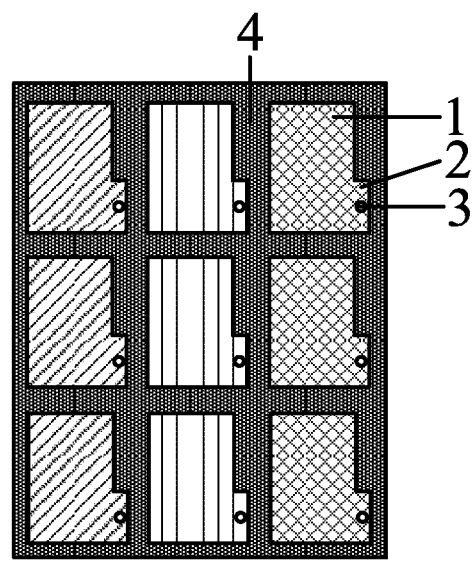
FIG. 1 is a top view of a display substrate according to an embodiment of the present disclosure.

Reference Numerals: 1, color filter; 11, red filter; 12, green filter; 13, blue filter; 2, auxiliary portion; 3, gas hole; 4, light-shielding pattern; 41, black matrix; 42, first portion; 43, second portion; 44, third portion; 5, base substrate; 6, insulation layer; 7, first electrode; 8, organic light emitting diode; 9, second electrode; 10, planarization layer; 20, color filter material; 30, transfer sacrificial layer; 40, transfer substrate; 401, hollow-out pattern; 402, bulge; 50, photothermal conversion layer; 60, transfer mask plate.

DETAILED DESCRIPTION

To make those skilled in the art better understand the technical solutions of the present disclosure, the present disclosure will be further described in detail below in conjunction with the accompanying drawings and specific implementations.

Referring to FIGS. 1 to 4, the present embodiment provides a display substrate including a base substrate 5 and a plurality of pixel regions on the base substrate 5. Each of the plurality of pixel regions is provided with a color filter 1 and an auxiliary portion 2 corresponding to the color filter 1. The color filter 1 and the auxiliary portion 2 are integrally formed. A gas hole 3 is provided in the auxiliary portion 2.

Referring to FIG. 1, the color filter 1 and the auxiliary portion 2 are connected to each other, and the auxiliary portion 2 is provided in a peripheral region of the color filter 1 and integrally formed with the color filter 1, that is, the color filter 1 is made of the same material as the auxiliary portion 2. The gas hole 3 is provided in the auxiliary portion 2 and can allow the generated gas to escape in the process of forming the color filter 1 and the auxiliary portion 2 by a laser transfer process, thus avoiding the occurrence of disuniform color filter 1 formed, and further improving product yield. By adopting a conventional coating method, however, it is easy to cause the color filters of various colors (R, G, B) to overlap, and because the material for forming the color filters is typically an organic material, gas will be generated in the process of forming the color filters, and the gas remains in the color filters and cannot escape therefrom, thereby resulting lowered product yield.

Needless to say, in the present disclosure, shape and size of the auxiliary portion 2 are not limited thereto as long as the gas hole 3 is formed inside the auxiliary portion 2, which is not described herein. In the present embodiment, the reason why the laser transfer process is adopted to form the color filter 1 and the auxiliary portion 2 is that the color filter 1 and the auxiliary portion 2 can be formed at a predetermined position using a transfer plate by the laser transfer process, which can avoid overlapping of color filters 1 of various colors.

In some embodiments, a light-shielding pattern 4 is provided between any two adjacent pixels (i.e., color filters).

It can be seen from FIG. 1 that the light-shielding pattern 4 is provided between two adjacent pixels to avoid light leakage or light mixing between two adjacent color filters 1.

Figure 2:
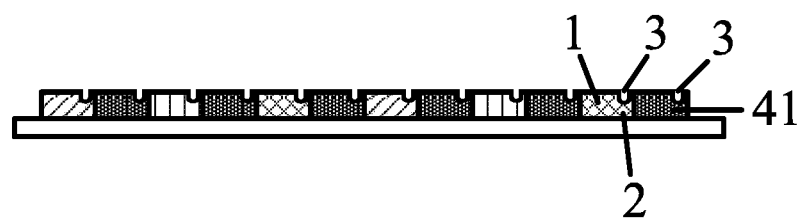
FIG. 2 is a schematic structure diagram of some examples of the display substrate according to the embodiment of the present disclosure.

In some embodiments, referring to FIG. 2, the light-shielding pattern 4 includes a black matrix 41.

It can be understood that, the black matrix 41 may also be formed by a laser transfer process because the black matrix 41 is typically made of a black resin material.

In some embodiments, a gas hole 3 is provided in the black matrix 41.

The reason for providing the gas hole 3 in the black matrix 41 is also to allow the generated gas to escape in the process of forming the black matrix 41 by the laser transfer process.

Figure 3:
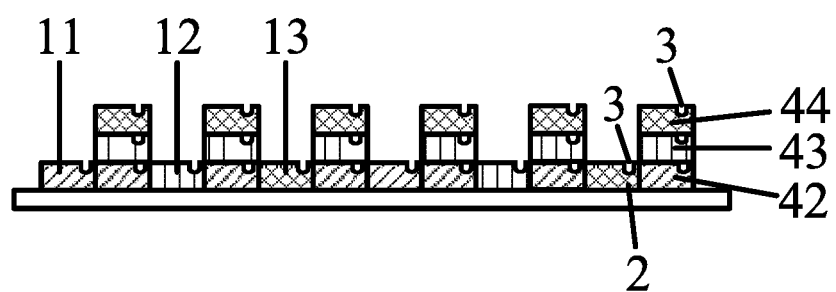
FIG. 3 is a schematic structure diagram of some examples of the display substrate according to the embodiment of the present disclosure.

In some embodiments, referring to FIG. 3, the color filters 1 of different colors include a red filter 11, a green filter 12, and a blue filter 13, and the light-shielding pattern 4 includes a first portion 42, a second portion 43 and a third portion 44, which are sequentially stacked. The red filter 11 and the first portion 42 are provided in a same layer and made of a same material. The green filter 12 and the second portion 43 are provided in a same layer and made of a same material. The blue filter 13 and the third portion 44 are provided in a same layer and made of a same material.

Specifically, the light-shielding pattern 4 includes the first portion 42, the second portion 43 and the third portion 44, which are sequentially stacked from bottom to top, and the first portion 42, the second portion 43 and the third portion 44 stacked are provided between the red filter 11, the green filter 12 and the blue filter 13. After the first portion 42, the second portion 43 and the third portion 44 are stacked, a black matrix-like structure can be formed, so as to block positions between two adjacent color filters and avoid light leakage or light mixing at positions between two adjacent color filters. The red filter 11 and the first portion 42 are provided in a same layer and made of a same material, that is, the red filter 11 and the first portion 42 may be formed simultaneously. Different from the red filter 11, the green filter 12 and the second portion 43 are provided in a same layer and made of a same material. The term "being provided in a same layer" as used herein does not mean that both are in a same layer in the macroeconomic sense, but means that both are formed by a single patterning process, that is, the green filter 12 and the second portion 43 may be formed simultaneously, but are in different layers in the macroeconomic sense. The term "a single patterning process" as used herein refers to a process of using a mask plate to perform one exposure process, and then performing development, photoresist stripping, and the like. Similarly, the blue filter 13 and the third portion 44 are provided in a same layer and made of a same material, that is, the blue filter 13 and the third portion 44 may be formed simultaneously, but are in different layers in the macroeconomic sense. Therefore, the first portion 42, the second portion 43 and the third portion 44 are not required to be formed in separate steps, respectively, thereby simplifying fabrication process of the display substrate and improving fabrication efficiency.

In the embodiment shown in FIG. 3, the second portion 43 is provided on the first portion 42, and the third portion 44 is provided on the second portion 43. Each of the first portion 42, the second portion 43 and the third portion 44 is provided with a gas hole 3. The reason for providing the gas hole 3 in each of the first portion 42, the second portion 43 and the third portion 44 is to allow the generated gas to escape in the process of forming the first portion 42, the second portion 43 and the third portion 44 by a laser transfer process and thus to improve product yield.

It should be noted that, the gas hole 3 adopted in the embodiment may be a groove, that is, the gas hole 3 has a depth less than a thickness of the auxiliary portion 2, the first portion 42, the second portion 43 or the third portion 44. Alternatively, the gas hole 3 may be a through hole, that is, the gas hole 3 has a depth equal to a thickness of the auxiliary portion 2, the first portion 42, the second portion 43 or the third portion 44. Any form can be used as long as the gas generated during the fabrication can escape, and no further description will be given here.

In some embodiments, the first portion 42 is the auxiliary portion 2 that is integrally formed with the red filter 11 and adjacent to the first portion 42.

In the present embodiment, because the first portion 42 and the red filter 11 are formed simultaneously, the first portion 42 formed adjacent to the red filter 11 may be formed integrally with the red filter 11. In this case, the first portion 42 is the auxiliary portion 2 connected to the red filter 11, and the gas hole 3 may be formed in the first portion 42, which can simplify fabrication process and improve fabrication efficiency.

Figure 4:
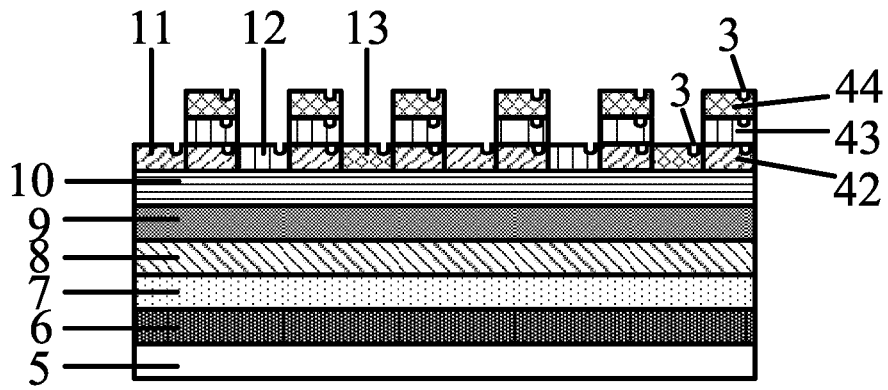
FIG. 4 is a schematic structure diagram of some examples of the display substrate according to the embodiment of the present disclosure.
Figure 5:
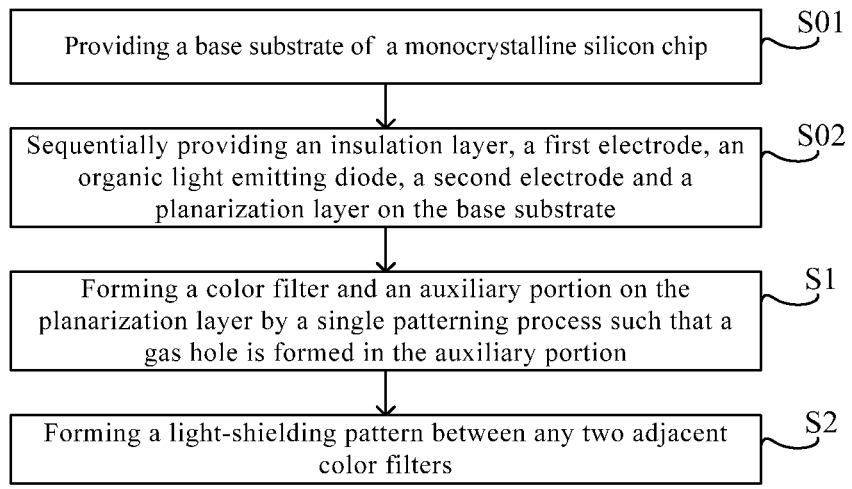
FIG. 5 is a flowchart of a fabrication method of a display substrate according to some embodiments of the present disclosure.

Referring to FIG. 4, the base substrate 5 includes a monocrystalline silicon chip. In other words, the display substrate of the present embodiment is a display substrate with a silicon base substrate.

An insulation layer 6, a first electrode 7, an organic light emitting diode 8, a second electrode 9 and a planarization layer 10 are sequentially provided from bottom to top between the base substrate 5 and the color filter 1.

In some embodiments, the organic light emitting diode 8 is a white organic light emitting diode. The reason for this arrangement is that, the red filter 11, the green filter 12 and the blue filter 13 are provided on the planarization layer 10, and thus, the display substrate can operates normally as long as the organic light emitting diode 8 can emit white light. It can be understood that, an anode, a cathode and a light emitting layer between the anode and the cathode are provided in the organic light emitting diode 8, which is not described here.

The display substrate of the present embodiment includes the base substrate 5 and the color filter 1 and the auxiliary portion 2 on the base substrate 5, the color filter 1 and the auxiliary portion 2 are integrally formed, and the gas hole 3 is provided in the auxiliary portion 2. Because the color filter 1 and the auxiliary portion 2 are integrally formed, during the formation of the color filter 1 and the auxiliary portion 2, the gas hole 3 provided in the auxiliary portion 2 can allow the gas generated in the process of forming the color filter 1 and the auxiliary portion 2 by a transfer process using a transfer material to escape, thereby forming a more uniform color filter 1 and further improving product yield.

This embodiment provides a display device including the display substrate of the embodiment. The display device may be any product or component with a display function, such as a liquid crystal display panel, an electronic paper, a mobile phone, a tablet computer, a television, a display, a notebook computer, a digital photo frame, a navigator or the like.

The display device of this embodiment includes the display substrate of the embodiment. Because the color filter and the auxiliary portion are integrally formed, during the formation of the color filter and the auxiliary portion, the gas hole provided in the auxiliary portion can allow the gas generated in the process of forming the color filter and the auxiliary portion by a transfer process using a transfer material to escape, thereby forming a more uniform color filter and further improving product yield.

Referring to FIGS. 5 to 13, this embodiment provides a method for fabricating a display substrate, which includes steps S01, S02, S1 and S2.

Figure 6:
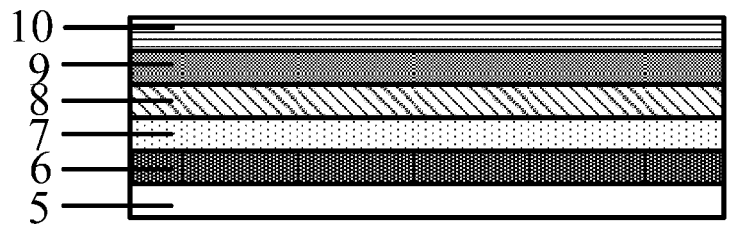
FIG. 6 is a schematic diagram of a structure relevant to steps S01 and S02 in the fabrication method of a display substrate according to some embodiments of the present disclosure.

Referring to FIG. 6, at step S01, a base substrate 5 of a monocrystalline silicon chip, is provided.

Referring to FIG. 6, at step S02, an insulation layer 6, a first electrode 7, an organic light emitting diode 8, a second electrode 9 and a planarization layer 10 are sequentially provided on the base substrate 5.

In some embodiments, the organic light emitting diode 8 is white organic light emitting diode.

It can be understood that, the step of forming the above structures may be performed by using known techniques and materials, and is not described here.

At step S1, color filters and auxiliary portions are formed on the planarization layer by a single patterning process, such that a gas hole is formed in the auxiliary portion.

Step S1 includes: sequentially providing a color filter material 20, a transfer sacrificial layer 30 and a transfer substrate 40 on the base substrate, hollow-out patterns 401 and bulges 402 being provided at predetermined positions of the transfer substrate 40; irradiating light to corresponding positions of the transfer sacrificial layer 30 via the hollow-out patterns 401 and the bulges 402; melting the transfer sacrificial layer 30 by heat so that the color filter material 20 corresponding to the hollow-out patterns 401 is transferred to predetermined positions on the base substrate to form the color filters and the auxiliary portions, and the bulges 402 allow the gas holes to be formed in the auxiliary portions.

Figure 7:
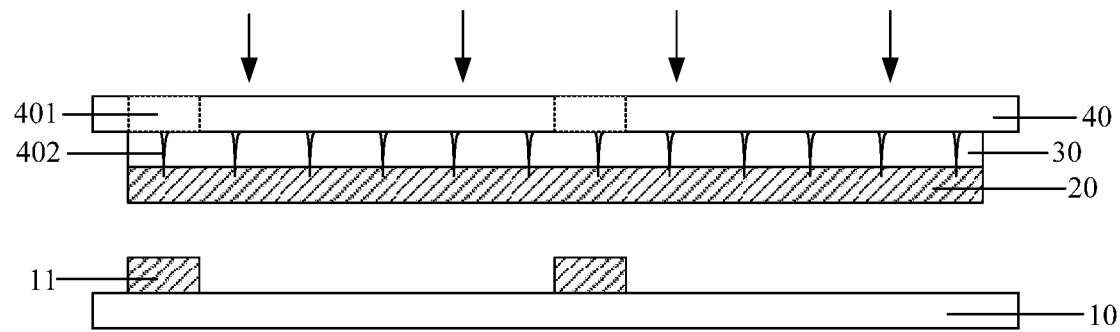
FIG. 7 is a schematic diagram of a first structure relevant to some examples of step S1 in the fabrication method of a display substrate according to the embodiment of the present disclosure.

Referring to FIG. 7, the transfer substrate 40 is made of a light tight material, and only the hollow-out patterns 401 in the transfer substrate 40 allow light to pass therethrough. A position corresponding to each hollow-out pattern 401 is provided with one bulge 402, and the bulge 402 blocks light. At this time, the color filter material 20 is a red filter material. Light (as shown by arrows) is irradiated on the transfer substrate 40 and allowed to pass only at positions corresponding to the hollow-out patterns 401. Light is then irradiated onto the transfer sacrificial layer 30, the material of the transfer sacrificial layer 30 is melted by light (or heat), and the red filter material corresponding to the hollow-out patterns 401 is transferred onto the planarization layer 10. Subsequently, the material of the transfer sacrificial layer 30 is removed by means of light irradiation, dissolution, or the like, so that the red filters 11 and the auxiliary portions integrally formed with the red filters 11 are formed at the predetermined positions on the planarization layer 10. At the same time, because the red filter material at positions corresponding to the bulges 402 will not be transferred onto the planarization layer 10, the gas holes will be formed in the auxiliary portions.

Figure 8:
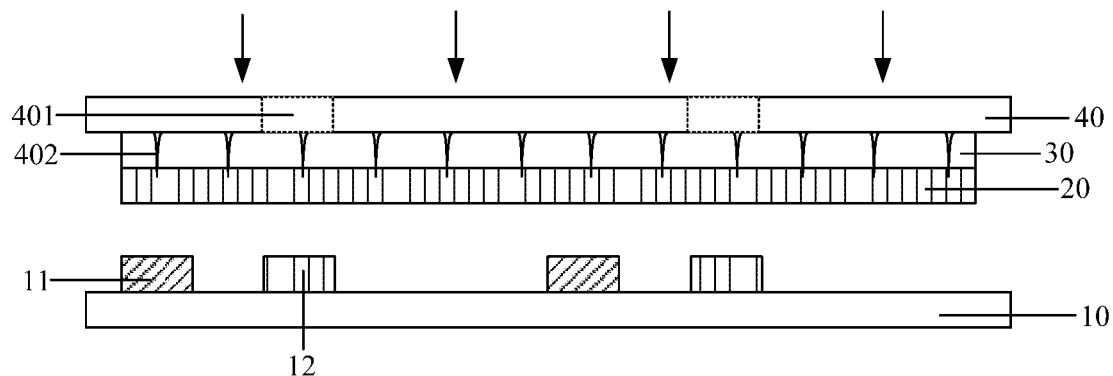
FIG. 8 is a schematic diagram of a second structure relevant to some examples of step S1 in the fabrication method of a display substrate according to the embodiment of the present disclosure.

Next, referring to FIG. 8, a color filter material 20, which is a green filter material, is provided on the base substrate. Through the same steps as above, green filters 12, the auxiliary portions formed integrally with the green filters 12 and the gas holes are formed on the planarization layer 10.

Figure 9:
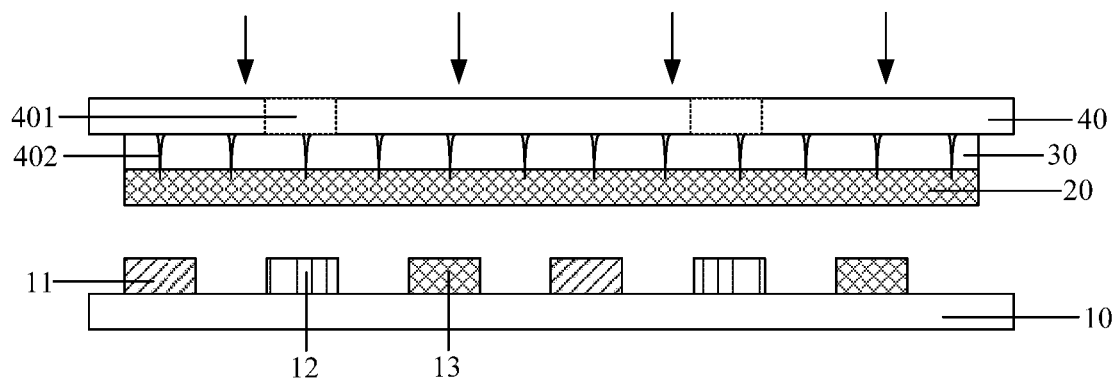
FIG. 9 is a schematic diagram of a third structure relevant to some examples of step S1 in the fabrication method of a display substrate according to the embodiment of the present disclosure.

Next, referring to FIG. 9, a color filter material 20, which is a blue filter material, is provided on the base substrate. Through the same steps as above, blue filters 13, the auxiliary portions formed integrally with the blue filters 13 and the gas holes are formed on the planarization layer 10.

It should be noted that, FIGS. 7 to 9 are only for schematically illustrating a process of forming the color filters, and do not illustrate specific structures of the auxiliary portion and the gas hole. The bulges 402 formed in this embodiment penetrate through the entire thickness of the transfer sacrificial layer 30, and in this case, the gas hole is formed as a groove. The bulges may also penetrate through an overall thickness of the transfer sacrificial layer 30 and the color filter material 20, and in this case, the gas hole is formed as a through hole.

At step S2, a light-shielding pattern is formed between any two adjacent color filters.

In some embodiments, the light-shielding pattern includes a black matrix 41.

Figure 10:
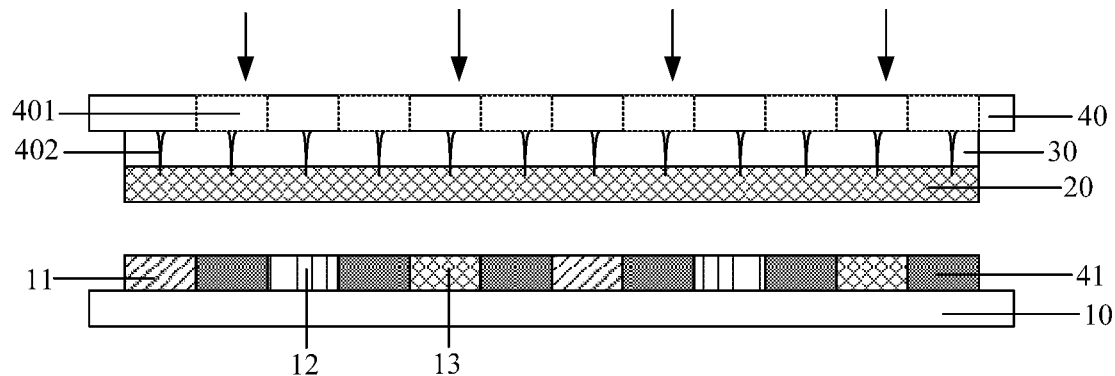
FIG. 10 is a schematic diagram of a structure relevant to step S2 in the fabrication method of a display substrate according to some embodiments of the present disclosure.

Referring to FIG. 10, step S2 includes: forming a black matrix 41 by a laser transfer process, and forming gas holes in the black matrix 41. The black matrix 41 and the gas holes in the black matrix 41 may be formed using a same method as the color filters, and it is only necessary to change the color filter material 20 to a black matrix material. Detailed description thereof will not be repeated here.

It should be noted that the sequence of steps S1 and S2 is not limited thereto, and may be reversed, which is not described here.

Apparently, various modifications may be made to steps of forming the color filters, the auxiliary portions and the light-shielding patterns in the embodiment.

In one example, step S1 includes: sequentially providing the color filter material 20, a photothermal conversion layer 50 and the transfer substrate 40 on the base substrate, hollow-out patterns 401 being provided at predetermined positions of the transfer substrate 40, and bulges 402 being provided on the photothermal conversion layer 50; irradiating light to corresponding positions of the photothermal conversion layer 50 via the hollow-out patterns 401; converting, by the photothermal conversion layer 50, the light into heat, so that the color filter material 20 corresponding to the hollow-out patterns 401 is transferred to predetermined positions on the base substrate to form the color filters and the auxiliary portions, and the bulges 402 allows the gas holes to be formed in the auxiliary portions.

The color filters include red filters 11, green filters 12 and blue filters 13. The light-shielding pattern includes a first portion 42, a second portion 43 and a third portion 44, which are stacked on each other.

Figure 11:
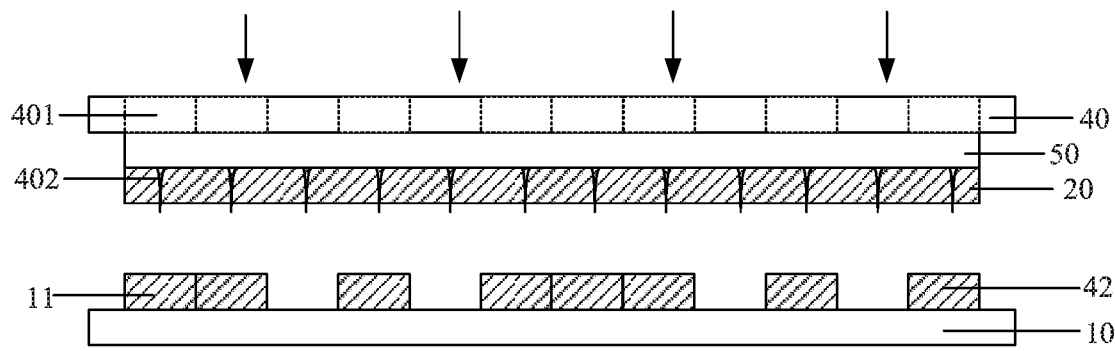
FIG. 11 is a schematic diagram of a first structure relevant to some examples of steps S1 and S2 in the fabrication method of a display substrate according to the embodiment of the present disclosure.

Steps S1 and S2 may be performed at the same time, and include:

as shown in FIG. 11, forming the red filters 11 and the first portions 42 by one laser transfer process, and forming the gas holes in the first portions 42.

Specifically, the transfer substrate 40 is made of a light tight material, and only the hollow-out patterns 401 in the transfer substrate 40 allow light to pass therethrough. A position corresponding to each hollow-out pattern 401 on the photothermal conversion layer 50 is provided with one bulge 402, and the bulge 402 blocks light. At this time, the color filter material 20 is a red filter material. Light (as shown by arrows) is irradiated on the transfer substrate 40 and allowed to pass only at positions corresponding to the hollow-out patterns 401. Light is then irradiated onto the photothermal conversion layer 50. The photothermal conversion layer 50 converts the light into heat, which causes the red filter material corresponding to the hollow-out patterns 401 to be transferred onto the planarization layer 10. In this way, the red filters 11, the auxiliary portions integrally formed with the red filters 11 and the first portions 42 are formed at the predetermined positions on the planarization layer 10. At the same time, because the red filter material at positions corresponding to the bulges 402 will not be transferred onto the planarization layer 10, the gas holes will be formed in the auxiliary portions and the first portions 42.

In some embodiments, the first portion 42 is the auxiliary portion 2 that is integrally formed with the red filter 11 and adjacent to the first portion 42.

In the present embodiment, because the first portion 42 and the red filter 11 are formed simultaneously, the first portion 42 formed adjacent to the red filter 11 may be formed integrally with the red filter 11. In this case, the first portion 42 is the auxiliary portion 2 connected to the red filter 11, and the gas hole 3 may be formed in the first portion 42, which can simplify fabrication process and improve fabrication efficiency.

Figure 12:
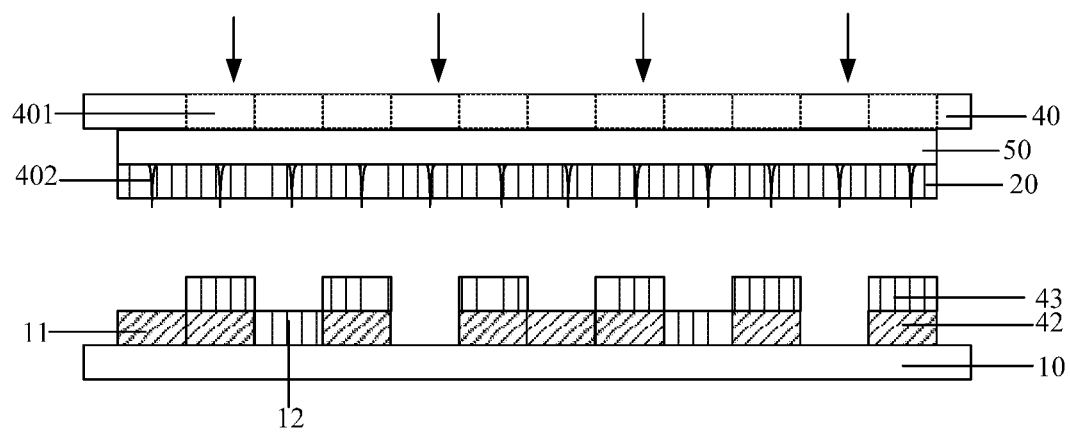
FIG. 12 is a schematic diagram of a second structure relevant to some examples of steps S1 and S2 in the fabrication method of a display substrate according to the embodiment of the present disclosure.

Referring to FIG. 12, the green filters 12 and the second portions 43 are formed by one laser transfer process, and the gas holes are formed in the second portions 43. In this case, the color filter material 20 is a green filter material, and the green filters 12, the auxiliary portions integrally formed with the green filters 12, the second portions 43 and the gas holes are formed on the planarization layer 10 through the same steps as above.

Figure 13:
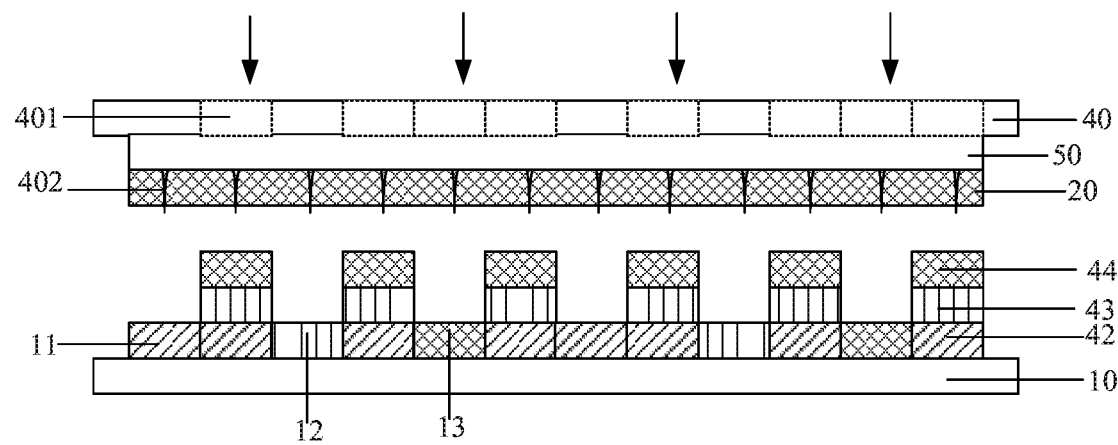
FIG. 13 is a schematic diagram of a third structure relevant to some examples of steps S1 and S2 in the fabrication method of a display substrate according to the embodiment of the present disclosure.
Figure 14:
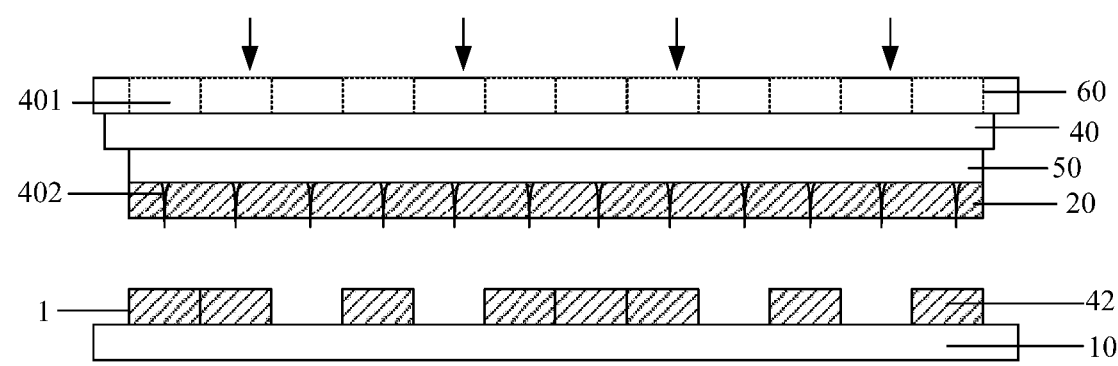
FIG. 14 is a schematic diagram of a structure relevant to some examples of steps S1 and S2 in the fabrication method of a display substrate according to the embodiment of the present disclosure.

Referring to FIG. 13, the blue filters 13 and the third portions 44 are formed by one laser transfer process, and the gas holes are formed in the third portions 44. In this case, the color filter material 20 is a blue filter material, and the blue filters 13, the auxiliary portions integrally formed with the blue filters 13, the third portions 44 and the gas holes are formed on the planarization layer 10 through the same steps as above.

In another example, step S1 includes: sequentially providing the color filter material 20, a photothermal conversion layer 50 and the transfer substrate 40 and a transfer mask plate 60 on the base substrate, the transfer substrate 40 being made of a transparent material, hollow-out patterns 401 being provided at predetermined positions of the transfer mask plate 60, and bulges being provided on the photothermal conversion layer 50; irradiating light to corresponding positions of the photothermal conversion layer 50 via the hollow-out patterns 401 and the transfer substrate 40 corresponding to the hollow-out patterns; converting, by the photothermal conversion layer 50, the light into heat, so that the color filter material 20 corresponding to the hollow-out patterns 401 is transferred to predetermined positions on the base substrate to form the color filters and the auxiliary portions, and the bulges allows the gas holes to be formed in the auxiliary portions.

The above step S1 differs from the step S1 in previous example in that the transfer substrate 40 is transparent and allows light to pass therethrough, the hollow-out patterns 401 are provided in the transfer mask plate 60 above the transfer substrate 40, and light is irradiated to corresponding positions of the photothermal conversion layer 50 after passing through the hollow-out patterns 401 and the transfer substrate 40 corresponding to the hollow-out patterns 401, so that the color filter material 20 corresponding to the hollow-out patterns 401 is transferred to predetermined positions on the base substrate.

The method for fabricating a display substrate in the embodiment is used for fabricating the display substrate of the embodiment. For detailed description thereof, the display substrate of the embodiment may be referred to. Repeated description will not be given here.

The method for fabricating a display substrate in the embodiment is used for fabricating the display substrate of the embodiment. Because the color filters and the auxiliary portions are integrally formed, during the formation of the color filters and the auxiliary portions, the gas holes provided in the auxiliary portions can allow the gas generated in the process of forming the color filters and the auxiliary portions by a transfer process using a transfer material to escape, thereby forming more uniform color filters and further improving product yield.

To sum up, in the display substrate, the fabrication method thereof, and the display device of the present disclosure, the display substrate includes the base substrate and the color filters and the auxiliary portions on the base substrate, the color filters and the auxiliary portions are integrally formed, and the gas holes are provided in the auxiliary portions. Because the color filters and the auxiliary portions are integrally formed, during the formation of the color filters and the auxiliary portions, the gas holes provided in the auxiliary portions can allow the gas generated in the process of forming the color filters and the auxiliary portions by a transfer process using a transfer material to escape, thereby forming more uniform color filters and further improving product yield.

It could be understood that the above embodiments are merely exemplary embodiments adopted for explaining the principle of the present disclosure, but the present disclosure is not limited thereto. Various variations and improvements may be made by those of ordinary skill in the art without departing from the above concepts of the present disclosure, and these variations and improvements shall also be regarded as falling into the protection scope of the present disclosure.

The invention claimed is:

1. A display substrate, comprising a base substrate and a plurality of pixel regions on one side of the base substrate,
wherein each of at least one pixel region of the plurality of pixel regions is provided with a color filter and an auxiliary portion, the color filter and the auxiliary portion are integrally formed, and a gas hole is provided in the auxiliary portion, and the gas hole is a groove on a surface of the auxiliary portion at a side distal to the base substrate or a through hole which penetrates through the auxiliary portion.

2. The display substrate of claim 1, wherein the auxiliary portion is in a peripheral region of the color filter.

3. The display substrate of claim 1, further comprising a light-shielding pattern between at least two adjacent pixel regions of the plurality of pixel regions.

4. The display substrate of claim 3, wherein the light-shielding pattern comprises a black matrix.

5. The display substrate of claim 4, wherein the black matrix comprises a gas hole.

6. The display substrate of claim 1, wherein at least three adjacent pixel regions of the plurality of pixel regions are provided with color filters of different colors, which comprise a red filter, a green filter and a blue filter, and the light-shielding pattern comprises a first portion, a second portion and a third portion sequentially stacked;
the red filter and the first portion are formed simultaneously and made of a same material;
the green filter and the second portion are formed simultaneously and made of a same material; and
the blue filter and the third portion are formed simultaneously and made of a same material.

7. The display substrate of claim 6, wherein each of the first portion, the second portion and the third portion is provided with a gas hole.

8. The display substrate of claim 7, wherein the first portion is the auxiliary portion, which is adjacent to the first portion and integrally formed with the red filter.

9. The display substrate of claim 1, wherein between the base substrate and the color filter, an insulation layer, a first electrode, an organic light emitting diode, a second electrode and a planarization layer are sequentially provided on the base substrate.

10. The display substrate of claim 9, wherein the organic light emitting diode is a white organic light emitting diode.

11. A display device, comprising the display substrate of claim 1.

12. A method for fabricating the display substrate of claim 1, comprising:
forming the color filter and the auxiliary portion on the base substrate by a single patterning process such that the gas hole is formed in the auxiliary portion such that the gas hole is a groove on a surface of the auxiliary portion at a side distal to the base substrate or a through hole which penetrates through the auxiliary portion.

13. The method of claim 12, wherein forming the color filter and the auxiliary portion on the base substrate by a single patterning process such that the gas hole is formed in the auxiliary portion comprises:
sequentially providing a color filter material, a transfer sacrificial layer and a transfer substrate on the base substrate such that a hollow-out pattern allowing light to pass therethrough and a bulge preventing light from passing therethrough are provided at predetermined positions of the transfer substrate; and
irradiating light to a corresponding position of the transfer sacrificial layer via the transfer substrate such that the transfer sacrificial layer is melt by heat, the color filter material corresponding to the hollow-out pattern is transferred to a position on the base substrate to form the color filter and the auxiliary portion, and the bulge allows the gas hole to be formed in the auxiliary portion.

14. The method of claim 12, wherein forming the color filter and the auxiliary portion on the base substrate by a single patterning process such that the gas hole is formed in the auxiliary portion comprises:
sequentially providing a color filter material, a photothermal conversion layer and a transfer substrate on the base substrate such that a hollow-out pattern allowing light to pass therethrough is provided at a predetermined position of the transfer substrate, and a bulge preventing light from passing therethrough is provided at a predetermined position of the photothermal conversion layer; and
irradiating light to a corresponding position of the photothermal conversion layer via the transfer substrate such that the light is converted to heat by the photothermal conversion layer, the color filter material corresponding to the hollow-out pattern is transferred to a predetermined position on the base substrate to form the color filter and the auxiliary portion, and the bulge allows the gas hole to be formed in the auxiliary portion.

15. The method of claim 12, wherein forming the color filter and the auxiliary portion on the base substrate by a single patterning process such that the gas hole is formed in the auxiliary portion comprises:
sequentially providing a color filter material, a photothermal conversion layer, a transfer substrate and a transfer mask plate on the base substrate such that the transfer substrate is made of a transparent material, a hollow-out pattern allowing light to pass therethrough is provided at a predetermined position of the transfer mask plate, and a bulge preventing light from passing therethrough is provided at a predetermined position of the photothermal conversion layer;
irradiating light to a corresponding position of the photothermal conversion layer via the transfer mask plate and the transfer substrate such that the light is converted to heat by the photothermal conversion layer, the color filter material corresponding to the hollow-out pattern is transferred to a predetermined position on the base substrate to form the color filter and the auxiliary portion, and the bulge allows the gas hole to be formed in the auxiliary portion.

16. The method of claim 12, further comprising:
forming a light-shielding pattern between at least two adjacent color filters.

17. The method of claim 16, wherein the light-shielding pattern comprises a black matrix, and any two adjacent pixel regions are provide with color filters of different colors;
wherein forming the light-shielding pattern between at least two adjacent color filters comprises:
forming the black matrix by a laser transfer process such that a gas hole is formed in the black matrix.

18. The method of claim 16, wherein at least three adjacent pixel regions of the plurality of pixel regions are provided with color filters of different colors, which comprise a red filter, a green filter and a blue filter, and the light-shielding pattern comprises a first portion, a second portion and a third portion sequentially stacked; and
wherein forming the light-shielding pattern between at least two adjacent color filters and forming the color filter and the auxiliary portion on the base substrate by a single patterning process such that the gas hole is formed in the auxiliary portion are performed simultaneously, and comprise:
forming the red filter and the first portion by a single laser transfer process such that a gas hole is formed in the first portion;
forming the green filter and the second portion by a single laser transfer process such that a gas hole is formed in the second portion; and forming the blue filter and the third portion by a single laser transfer process such that a gas hole is formed in the third portion.

19. A display substrate, comprising a base substrate and a plurality of pixel regions on one side of the base substrate,
wherein each of at least one pixel region of the plurality of pixel regions is provided with a color filter and an auxiliary portion, the color filter and the auxiliary portion are integrally formed, and a gas hole is provided in the auxiliary portion,
the display panel further comprises a light-shielding pattern between at least two adjacent pixel regions of the plurality of pixel regions,
the light-shielding pattern comprises a black matrix, and the black matrix comprises a gas hole.

20. The display substrate of claim 19, wherein at least three adjacent pixel regions of the plurality of pixel regions are provided with color filters of different colors, which comprise a red filter, a green filter and a blue filter, and the light-shielding pattern comprises a first portion, a second portion and a third portion sequentially stacked;
the red filter and the first portion are formed simultaneously and made of a same material;
the green filter and the second portion are formed simultaneously and made of a same material; and
the blue filter and the third portion are formed simultaneously and made of a same material.

* * * * *